(12) United States Patent  
Kim

(10) Patent No.: US 7,053,689 B2
(45) Date of Patent: May 30, 2006

(54) HIGH VOLTAGE SWITCH CIRCUIT

(75) Inventor: Young Joo Kim, Busan (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 169 days.

(21) Appl. No.: 10/879,848

(22) Filed: Jun. 29, 2004

(65) Prior Publication Data

US 2005/0122157 A1 Jun. 9, 2005

(30) Foreign Application Priority Data

Dec. 5, 2003 (KR) .................. 10-2003-0088269

(51) Int. Cl.
*H03K 17/16* (2006.01)
(52) U.S. Cl. .................. 327/390; 327/589; 327/536; 327/403

(58) Field of Classification Search ............... 327/390, 327/536, 589
See application file for complete search history.

(56) References Cited

U.S. PATENT DOCUMENTS

| 5,877,635 | A * | 3/1999 | Lin ..................... 326/88 |
| 6,486,729 | B1 * | 11/2002 | Imamiya ............... 327/536 |
| 6,903,595 | B1 * | 6/2005 | Won .................... 327/403 |
| 2004/0239399 | A1 * | 12/2004 | Won .................... 327/390 |

* cited by examiner

*Primary Examiner*—Long Nguyen
(74) *Attorney, Agent, or Firm*—Marshall, Gerstein & Borun LLP

(57) ABSTRACT

The present invention discloses a high voltage switch circuit of a semiconductor device which can reduce a discharge time by supplying a higher voltage than a power voltage to a gate terminal of a discharge transistor in a discharge unit for discharging a high voltage.

6 Claims, 2 Drawing Sheets

HIGH VOLTAGE SWITCH CIRCUIT

BACKGROUND

1. Field of the Invention

The present invention relates to a high voltage switch circuit of a semiconductor device, and more particularly to, a high voltage switch circuit which can reduce a discharge time.

2. Discussion of Related Art

A NAND flash memory device requires a pumping voltage higher than an input power voltage in the program, erase and read operations. In the program operation, programming and verification operations are performed in a pair. A very lower bias is supplied to a word line in the verification operation than in the programming operation. This procedure is repeated until the verification operation is successfully performed within a maximum loop set in the two operations. A bias discharge time for the verification operation is quite long and more increased in the erase operation.

FIG. 1 is a waveform diagram showing discharge problems of a conventional high voltage switch circuit.

Referring to FIG. 1, a high voltage which is an output from a pumping unit is supplied according to a predetermined enable signal. When the high voltage is not supplied due to variations of the enable signal, a discharge time over about 1 μs is generated in the conventional high voltage switch circuit. That is, a general discharge circuit discharges a high voltage by using a high voltage NMOS transistor having its drain terminal connected to a charge pump terminal, its source terminal connected to a ground power, and its gate terminal connected to receive a power voltage. When only the power voltage is used, the discharge time is much more delayed in a low power voltage of the operation power voltage range than in a general mode. An NMOS size can be controlled to overcome the foregoing problems, which does not efficiently reduce the discharge time.

SUMMARY OF THE INVENTION

The present invention is directed to a high voltage switch circuit which can control a discharge time of a high voltage which is an output from a high voltage switch unit by a discharge unit using a pumping cap.

One aspect of the present invention is to provide a high voltage switch circuit, comprising: a discharge node; a high voltage switch unit for switching an external high voltage according to a high voltage transmission enable signal and a clock signal; a first NMOS transistor for discharging a high voltage which is the output from the high voltage switch unit according to the discharge node; a power voltage transmission unit for transmitting a power voltage to the discharge node according to the high voltage transmission enable signal; a second NMOS transistor for controlling a voltage of the discharge node according to the high voltage transmission enable signal; and a voltage pumping unit for increasing the voltage of the discharge node by a predetermined level according to the high voltage transmission enable signal and the clock signal.

Preferably, the power voltage transmission unit includes a PMOS transistor and a third NMOS transistor connected in series between the power voltage and the discharge node. The PMOS transistor is driven according to the high voltage transmission enable signal, and the third NMOS transistor is driven according to the power voltage transmitted through the PMOS transistor.

Preferably, the voltage pumping unit includes: an inverter for inverting the high voltage transmission enable signal; a NAND gate for NANDing the output from the inverter and the clock signal; and a fourth NMOS transistor capacitor-coupled for increasing the voltage of the discharge node by the predetermined level according to the output from the NAND gate.

Onother aspect of the present invention is to provide a high voltage switch circuit, comprising: a discharge node; a high voltage switch unit for switching an external high voltage according to a high voltage transmission enable signal and a clock signal; a first NMOS transistor for discharging a high voltage which is the output from the high voltage switch unit according to the discharge node; a power voltage transmission unit for transmitting a power voltage to the discharge node according to the high voltage transmission enable signal, wherein the power voltage transmission unit includes a PMOS transistor and a third NMOS transistor connected in series between the power voltage and the discharge node; a second NMOS transistor for controlling a voltage of the discharge node according to the high voltage transmission enable signal; and a voltage pumping unit for increasing the voltage of the discharge node by a predetermined level according to the high voltage transmission enable signal and the clock signal, wherein the voltage pumping unit includes an inverter for inverting the high voltage transmission enable signal, a NAND gate for NANDing the output from the inverter and the clock signal and a fourth NMOS transistor capacitor-coupled for increasing the voltage of the discharge node by the predetermined level according to the output from the NAND gate.

DETAILED DESCRIPTION OF PREFERRED EMBODIMENTS

A high voltage switch circuit in accordance with a preferred embodiment of the present invention will now be described in detail with reference to the accompanying drawings.

Figure 1:
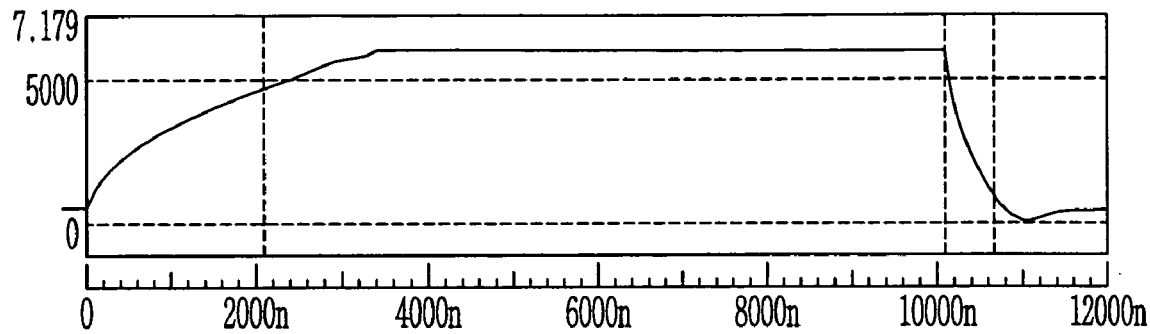
FIG. 1 is a waveform diagram showing discharge problems of a conventional high voltage switch circuit.
Figure 2:
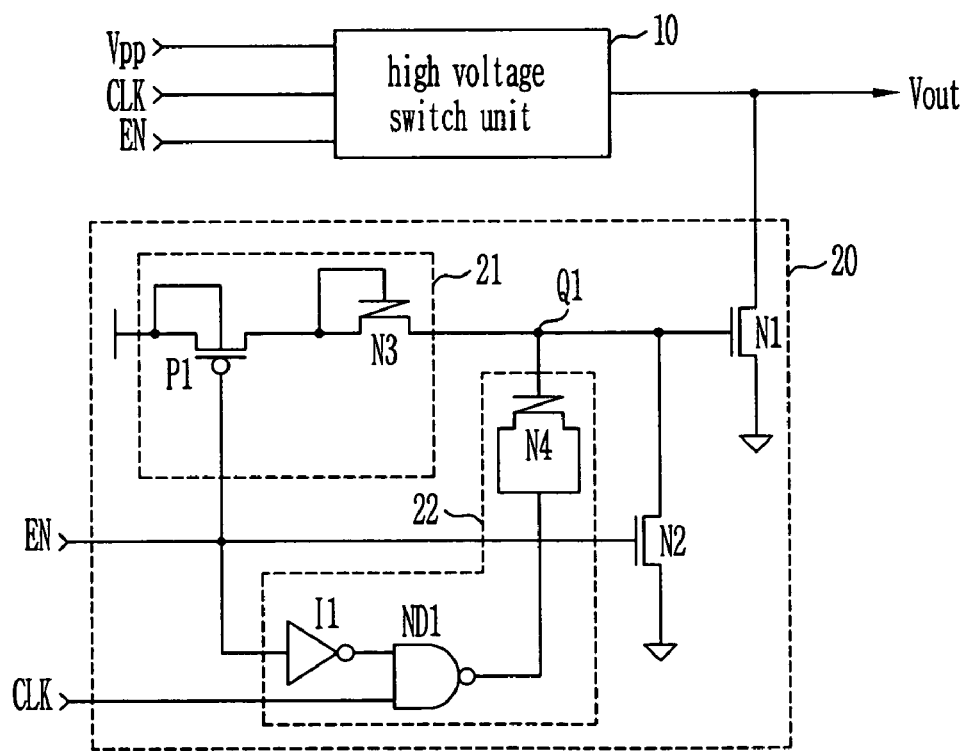
FIG. 2 is a circuit diagram illustrating a high voltage switch circuit in accordance with the present invention.

FIG. 2 is a circuit diagram illustrating the high voltage switch circuit in accordance with the present invention.

As illustrated in FIG. 2, the high voltage switch circuit includes a high voltage switch unit 10 for switching an external high voltage Vpp according to a high voltage transmission enable signal EN and a clock signal CLK, and a discharge unit 20 for discharging the output from the high voltage switch unit 10 according to the high voltage transmission enable signal EN and the clock signal CLK. The high voltage switch circuit further includes a high voltage generation pump unit (not shown) for generating a high voltage according to the clock signal CLK and the high voltage transmission enable signal EN.

The discharge unit 20 includes a discharge node Q1, a first NMOS transistor N1 for discharging a high voltage output node of the high voltage switch unit 10 to a ground power Vss according to the discharge node Q1, a power voltage transmission unit 21 for transmitting a power voltage Vcc to the discharge node Q1 according to the high voltage transmission enable signal EN, a second NMOS transistor N2 for controlling a voltage of the discharge node Q1 according to the high voltage transmission enable signal EN, and a voltage pumping unit 22 for increasing a voltage of the discharge node Q1 by a predetermined level according to the high voltage transmission enable signal EN and the clock signal CLK.

The power voltage transmission unit 21 includes a first PMOS transistor P1 and a third NMOS transistor N3 connected in series between the power voltage Vcc and the discharge node Q1. The first PMOS transistor P1 is driven according to the high voltage transmission enable signal EN, and the third NMOS transistor N3 is driven according to a source terminal of the first PMOS transistor P1. A well of the third NMOS transistor N3 is coupled to the power voltage Vcc.

The voltage pumping unit 22 includes a first inverter 11 for inverting the high voltage transmission enable signal EN, a NAND gate ND1 for NANDing the output from the first inverter 11 and the clock signal CLK, and a fourth NMOS transistor N4 capacitor-coupled for increasing the voltage of the discharge node Q1 by the predetermined level according to the output from the NAND gate ND1.

The first NMOS transistor N1 is a discharge transistor for discharging a high voltage Vout of the high voltage output node. Preferably, a high voltage transistor is used as the first NMOS transistor N1, and native transistors are used as the third and fourth NMOS transistors N3 and N4. The high voltage switch unit 10 has a high voltage NMOS transistor for switching a high voltage, and can be embodied as various circuits for supplying the high voltage to the high voltage NMOS transistor.

The operation of the high voltage switch circuit in accordance with the present invention will now be explained.

The high voltage switch circuit is a circuit for switching a high voltage. When the high voltage transmission enable signal EN is logic high, the high voltage switch circuit switches a charged high voltage, and when the high voltage transmission enable signal EN is logic low, the high voltage switch circuit discharges the high voltage.

When the high voltage transmission enable signal EN is logic high, an internal clock generator generates a clock signal to drive the high voltage generation pump unit, thereby generating the high voltage Vpp. The high voltage Vpp is outputted to the high voltage output node Vout by the high voltage switch unit 10 enabled according to the high voltage transmission enable signal EN and the clock signal CLK. In the discharge unit 20, the first PMOS transistor P1 is not driven according to the high voltage transmission enable signal EN, and the second NMOS transistor N2 is driven to supply the ground power Vss to the discharge node Q1. Because the first NMOS transistor N1 is not driven by the discharge node Q1 of a logic low ground power state, the high voltage Vout which is the output from the high voltage switch unit 10 is transmitted to the succeeding terminal through the high voltage output node.

On the other hand, when the high voltage transmission enable signal EN is logic low, the operation of the high voltage generation pump unit is disabled, and the operation of the high voltage switch unit 20 is also disabled. Accordingly, the high voltage is not generated and transmitted any more. Here, the discharge unit 20 is driven to discharge the high voltage Vout which is the output from the high voltage switch unit 10. The second NMOS transistor N2 is not driven according to the logic low high voltage transmission enable signal EN, and the first PMOS transistor P1 is driven according to the high voltage transmission enable signal EN. The power voltage Vcc is supplied to the discharge node Q1 by the first PMOS transistor P1 and the third NMOS transistor N3. The high voltage transmission enable signal EN inverted by the first inverter 11 becomes logic high and is supplied to the NAND gate ND1. A voltage of one side node of the fourth NMOS transistor N4 which is capacitor-coupled is changed by the clock signal CLK supplied to the other input terminal of the NAND gate ND1. The fourth NMOS transistor N4 which is capacitor-coupled increases the power voltage Vcc supplied to the discharge node Q1 by the predetermined level. Therefore, the high voltage Vout of the high voltage output node which is the output from the high voltage switch unit 10 can be efficiently discharged by increasing a voltage of a gate terminal of the first NMOS transistor N1 driven by the discharge node Q1.

Generally, the high voltage must be discharged considering that a loading cap of the high voltage output node is a few hundreds pF. When only the power voltage is supplied to the first NMOS transistor N1, the discharge time has limits due to limits of Vgs differences. In accordance with the present invention, the voltage pumping unit 22 is disposed in the discharge unit 20, for supplying a higher voltage than the power voltage Vcc to the discharge node Q1. A bias level for sufficiently controlling Vgs is obtained by efficiently controlling the discharge node Q1, which is advantageous in the discharge time.

Figure 3:
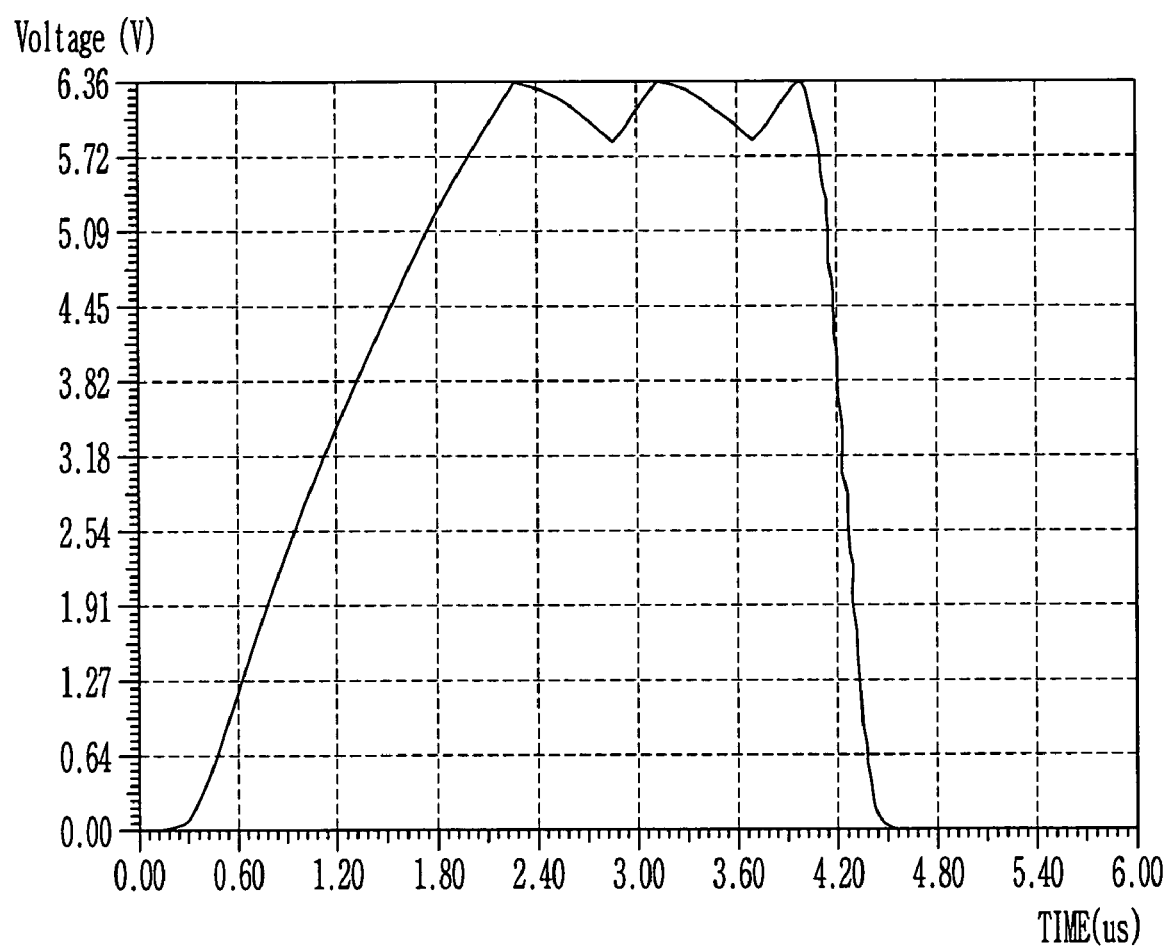
FIG. 3 is a waveform diagram showing voltage variations of the high voltage switch circuit in accordance with the present invention.

FIG. 3 is a waveform diagram showing voltage variations of the high voltage switch circuit in accordance with the present invention.

As shown in FIG. 3, when the high voltage transmission enable signal EN is logic high, the high voltage switch circuit switches a high voltage over 5V, and when the high voltage transmission enable signal EN is logic low, the high voltage switch circuit discharges the high voltage over 5V to 0V during the predetermined discharge time. In accordance with the present invention, the high voltage switch circuit supplies a higher voltage than the power voltage Vcc to the discharge transistor by disposing the voltage pumping unit 22 in the discharge unit 20, to maintain the discharge time below 500 ns.

As discussed earlier, in accordance with the present invention, the high voltage switch circuit can reduce the discharge time by supplying a higher voltage than the power voltage to the gate terminal of the discharge transistor in the discharge unit for discharging the high voltage.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:
1. A high voltage switch circuit, comprising:
   a discharge node;
   a high voltage switch unit for switching an external high voltage according to a high voltage transmission enable signal and a clock signal;
   a first NMOS transistor for discharging a high voltage which is the output from the high voltage switch unit according to the discharge node;
   a power voltage transmission unit for transmitting a power voltage to the discharge node according to the high voltage transmission enable signal;

a second NMOS transistor for controlling a voltage of the discharge node according to the high voltage transmission enable signal; and a voltage pumping unit for increasing the voltage of the discharge node by a predetermined level according to the high voltage transmission enable signal and the clock signal.

2. The circuit of claim 1, wherein the power voltage transmission unit includes a PMOS transistor and a third NMOS transistor connected in series between the power voltage and the discharge node.

3. The circuit of claim 2, wherein the PMOS transistor is driven according to the high voltage transmission enable signal, and the third NMOS transistor is driven according to the power voltage transmitted through the PMOS transistor.

4. The circuit of claim 1, wherein the voltage pumping unit includes:

an inverter for inverting the high voltage transmission enable signal;

a NAND gate for NANDing the output from the inverter and the clock signal; and a fourth NMOS transistor capacitor-coupled for increasing the voltage of the discharge node by the predetermined level according to the output from the NAND gate.

5. A high voltage switch circuit, comprising:

a discharge node;

a high voltage switch unit for switching an external high voltage according to a high voltage transmission enable signal and a clock signal;

a first NMOS transistor for discharging a high voltage which is the output from the high voltage switch unit according to the discharge node;

a power voltage transmission unit for transmitting a power voltage to the discharge node according to the high voltage transmission enable signal, wherein the power voltage transmission unit includes a PMOS transistor and a third NMOS transistor connected in series between the power voltage and the discharge node;

a second NMOS transistor for controlling a voltage of the discharge node according to the high voltage transmission enable signal; and a voltage pumping unit for increasing the voltage of the discharge node by a predetermined level according to the high voltage transmission enable signal and the clock signal, wherein the voltage pumping unit includes an inverter for inverting the high voltage transmission enable signal, a NAND gate for NANDing the output from the inverter and the clock signal and a fourth NMOS transistor capacitor-coupled for increasing the voltage of the discharge node by the predetermined level according to the output from the NAND gate.

6. The circuit of claim 5, wherein the PMOS transistor is driven according to the high voltage transmission enable signal, and the third NMOS transistor is driven according to the power voltage transmitted through the PMOS transistor.

* * * * *